(12) United States Patent
Wang et al.

(10) Patent No.: US 12,302,560 B2
(45) Date of Patent: May 13, 2025

(54) THREE-DIMENSIONAL MEMORY DEVICE WITH DIVIDED DRAIN SELECT GATE LINES AND METHOD FOR FORMING THE SAME

(71) Applicant: YANGTZE MEMORY TECHNOLOGIES CO., LTD., Wuhan (CN)

(72) Inventors: Di Wang, Wuhan (CN); Yan Gu, Wuhan (CN); Zhiliang Xia, Wuhan (CN); Wenxi Zhou, Wuhan (CN); Zongliang Huo, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 312 days.

(21) Appl. No.: 17/568,630

(22) Filed: Jan. 4, 2022

(65) Prior Publication Data
US 2023/0189521 A1    Jun. 15, 2023

Related U.S. Application Data

(63) Continuation of application No. PCT/CN2021/137400, filed on Dec. 13, 2021.

(51) Int. Cl.
*H10B 43/20* (2023.01)
*H01L 21/28* (2006.01)
(Continued)

(52) U.S. Cl.
CPC ........... *H10B 43/20* (2023.02); *H10D 30/696* (2025.01); *H10D 64/037* (2025.01); *H10D 64/679* (2025.01)

(58) Field of Classification Search
CPC ........ H10B 43/20; H10B 43/50; H10B 43/10; H10B 43/27; H10B 43/35; H01L 29/40117; H01L 29/42344; H01L 29/4991
See application file for complete search history.

(56) References Cited

U.S. PATENT DOCUMENTS 10,741,576 B2 *  8/2020  Nishikawa ........ H01L 21/76829
10,748,927 B1 *  8/2020  Tsutsumi ............... H10B 41/41
(Continued)

FOREIGN PATENT DOCUMENTS

CN      109791931 A     5/2019
CN      109791932 A     5/2019
(Continued)

OTHER PUBLICATIONS

International Search Report issued in corresponding International Application No. PCT/CN2021/137400, mailed Jul. 27, 2022, 4 pages.
(Continued)

*Primary Examiner* — Khaja Ahmad
*Assistant Examiner* — Khatib A Rahman
(74) *Attorney, Agent, or Firm* — BAYES PLLC

(57) ABSTRACT

A memory device includes a stack structure over a substrate, a channel structure extending in the stack structure, and a dielectric layer over the channel structure. The dielectric layer includes a first material. The memory device may also include a drain-select gate (DSG) cut structure extending through the dielectric layer. The DSG cut structure includes a second material different from the first material.

20 Claims, 10 Drawing Sheets

(51) Int. Cl.
  *H01L 29/423* (2006.01)
  *H01L 29/49* (2006.01)
  *H10D 30/69* (2025.01)
  *H10D 64/01* (2025.01)
  *H10D 64/66* (2025.01)

(56) References Cited

U.S. PATENT DOCUMENTS

| | | | |
|---|---|---|---|
| 10,777,575 B1 * | 9/2020 | Cui | H10B 43/10 |
| 10,790,300 B2 * | 9/2020 | Rajashekhar | H10B 43/40 |
| 10,797,061 B2 * | 10/2020 | Nishida | H10B 43/27 |
| 10,797,076 B2 * | 10/2020 | Hua | H01L 21/31111 |
| 10,868,025 B2 * | 12/2020 | Zhou | H10B 43/40 |
| 10,943,917 B2 * | 3/2021 | Iwai | H01L 21/762 |
| 2019/0067025 A1 | 2/2019 | Yada et al. | |
| 2019/0252396 A1 * | 8/2019 | Mushiga | H01L 21/76877 |
| 2020/0251488 A1 | 8/2020 | Iwai et al. | |
| 2020/0303397 A1 | 9/2020 | Cui et al. | |
| 2021/0143166 A1 * | 5/2021 | Chen | H10B 43/27 |
| 2021/0328034 A1 | 10/2021 | Lin et al. | |
| 2021/0335812 A1 | 10/2021 | Wu et al. | |
| 2022/0085045 A1 * | 3/2022 | Nagashima | H10B 43/27 |
| 2023/0180488 A1 * | 6/2023 | Kobayashi | G11C 11/4094 257/298 |

FOREIGN PATENT DOCUMENTS

| | | |
|---|---|---|
| CN | 111448662 A | 7/2020 |
| CN | 111886696 A | 11/2020 |
| CN | 111902938 A | 11/2020 |
| CN | 113410251 A | 9/2021 |
| JP | 2017135238 A | 8/2017 |
| JP | 2019521463 A | 7/2019 |
| KR | 20160118421 A | 10/2016 |
| TW | 202129923 A | 8/2021 |

OTHER PUBLICATIONS

Extended European Search Report issued in corresponding EP Application No. 21943331.5, mailed Aug. 31, 2023, 9 pages.

* cited by examiner

400 ical Application No. PCT/CN2021/137400, filed on Dec. 13, 2021, entitled "THREE-DIMENSIONAL MEMORY DEVICE WITH DIVIDED DRAIN SELECT GATE LINES AND METHOD FOR FORMING THE SAME," which is hereby incorporated by reference in its entirety.

THREE-DIMENSIONAL MEMORY DEVICE WITH DIVIDED DRAIN SELECT GATE LINES AND METHOD FOR FORMING THE SAME

CROSS-REFERENCE TO RELATED APPLICATIONS

This application is continuation of International Application No. PCT/CN2021/137400, filed on Dec. 13, 2021, entitled "THREE-DIMENSIONAL MEMORY DEVICE WITH DIVIDED DRAIN SELECT GATE LINES AND METHOD FOR FORMING THE SAME," which is hereby incorporated by reference in its entirety.

BACKGROUND

The present disclosure relates to memory devices and methods for forming memory devices.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A three-dimensional (3D) memory architecture can address the density limitation in planar memory cells. The 3D memory architecture includes a memory array and peripheral circuits for facilitating operations of the memory array.

SUMMARY

In one aspect, a memory device is disclosed. The memory device includes a stack structure over a substrate, a channel structure extending in the stack structure, and a dielectric layer over the channel structure. The dielectric layer includes a first material. The memory device may also include a DSG cut structure extending through the dielectric layer. The DSG cut structure includes a second material different from the first material.

In another aspect, a memory system is disclosed. The memory system includes a memory device configured to store data. The memory device includes a stack structure over a substrate, a channel structure extending in the stack structure, a dielectric layer over the channel structure, the dielectric layer having a first material, and a DSG cut structure extending through the dielectric layer. The DSG cut structure includes a second material different from the first material. The memory system also includes a memory controller coupled to the memory device and configured to control operations of the channel structure.

In still another aspect, a method for forming a memory device is disclosed. The method includes forming a stack structure over a substrate, forming a channel structure extending in the stack structure, depositing a first material to form a dielectric layer over the channel structure, and patterning the dielectric layer and the stack structure to form an opening, the opening through the dielectric layer and in contact with a conductive layer in a top portion of the stack structure. The method may also include depositing a second material into the opening to form a DSG cut structure. The second material is different from the first material. The method may further include forming a contact in the dielectric layer and in contact with the channel structure.

BRIEF DESCRIPTION OF THE DRAWINGS

The accompanying drawings, which are incorporated herein and form a part of the specification, illustrate aspects of the present disclosure and, together with the description, further serve to explain the present disclosure and to enable a person skilled in the pertinent art to make and use the present disclosure.

Figure 1A:
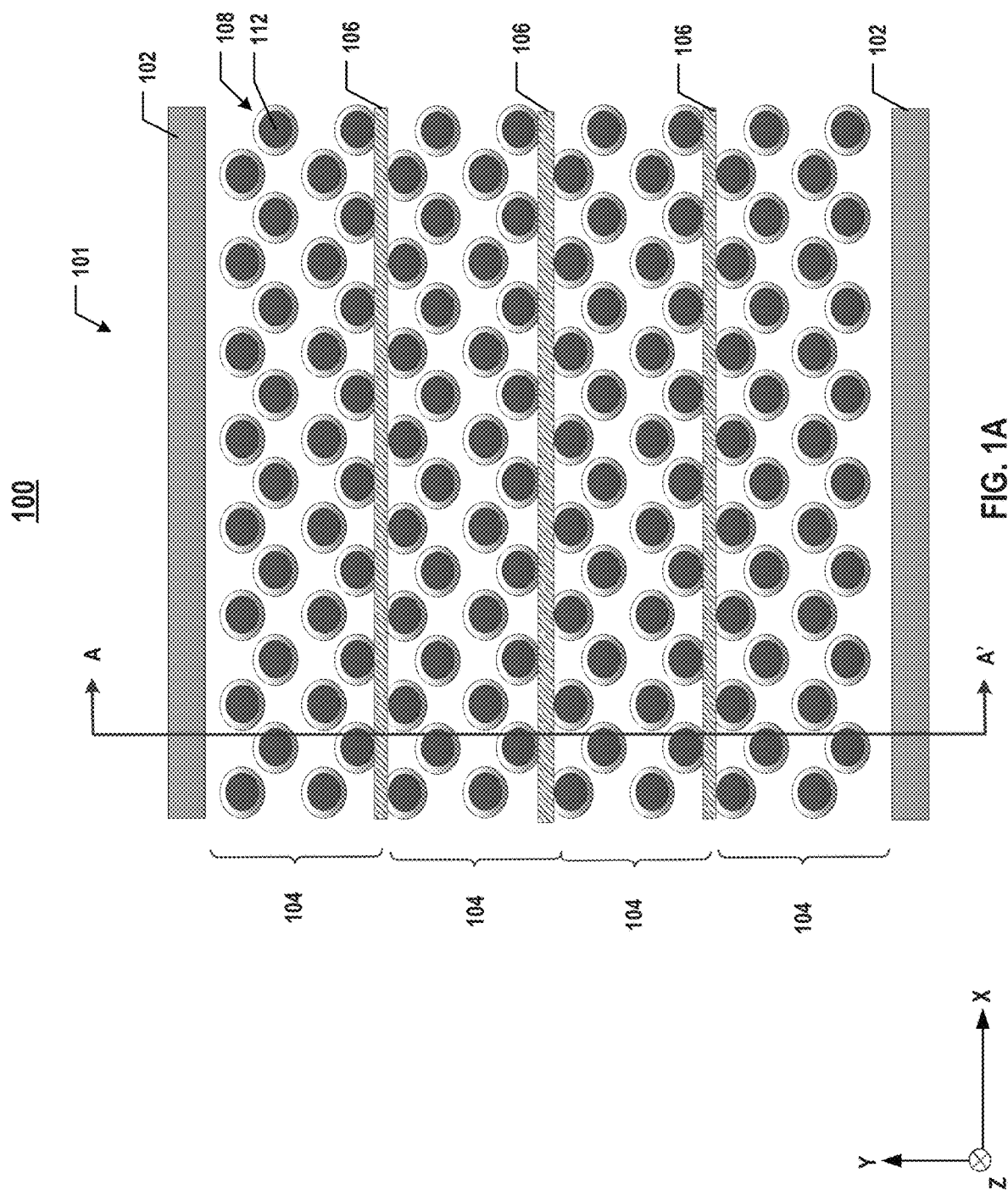
FIG. 1A illustrates a top view of an exemplary 3D memory device, according to some aspects of the present disclosure.

The present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present discloses.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations), and the spatially relative descriptors used herein may likewise be interpreted accordingly.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

In some 3D memory devices, such as 3D NAND memory devices, memory cells are formed in functional channel structures that extend in a stack structure of interleaved stack conductive layers and stack dielectric layers. As the demand for higher capacity continues to rise, channel structures now have a more compact lateral arrangement to increase the number/density of memory cells, and thus the capacity of the 3D memory device. One way to increase the capacity is to allocate more functional channel structures in a memory block of a 3D memory device. For example, instead of 9 rows, 12 rows or 16 rows of functional channel structures can be arranged in a memory block. Another way, additionally or alternatively, is to reduce the number of dummy channel structures to form more functional channel structures in a memory block. Often, no memory cells are formed in dummy channel structures.

To operate a 3D memory device, the memory cells are divided into memory blocks, which are further divided into strings. For example, a drain-select gate (DSG) cut structure is often formed between adjacent strings in a memory block to disconnect DSGs in different strings. The strings can then be selected through the respective DSGs in various operations. A DSG cut structure is often formed above a dummy channel structure. To reduce the number of dummy channel structures, the dummy channel structures are not formed, and the DSG cut structures are formed between the strings while above a functional channel structure. A DSG cut structure is in contact with a row of functional channel structures and one or more DSGs of a string such that DSGs of the adjacent strings are disconnected. Vertically, the DSG cut structure partially overlaps with the channel structure, e.g., the drain of the channel structure.

After a DSG cut structure is formed in the stack structure, a contact, e.g., channel contact, is formed above and in contact with the functional channel structure. The contact can apply a drain voltage on the functional channel structure during operations. The contact is often formed in a dielectric layer over the functional channel structure. The dielectric layer and the DSG cut structure, in contact with the functional channel structure, often have the same dielectric material, such as silicon oxide. To form the contact, an opening is first formed in the dielectric layer to expose the underlying drain of the functional channel structure, and a conductive material is deposited in the opening. Vertically, the opening often partially overlaps with the DSG cut structure. Because the dielectric layer and the DSG cut structure have the same material, the etchant for forming the opening often over etches the DSG cut structure, resulting in an undesirable etched area in the functional channel structure. The conductive material may then be deposited in the undesirable etched area, causing issues such as short circuits and/or leakage.

The present disclosure provides a 3D memory device with a DSG cut structure containing an etch-stop material and the fabrication process to form the DSG cut structure. The etch-stop material is a different material than the dielectric layer over the channel structure. For example, the dielectric layer includes silicon oxide, and the etch-stop material includes silicon nitride. In some implementations, the etch-stop material consists of silicon nitride. In some implementations, the etch-stop material includes silicon nitride, silicon oxide, and/or an air gap. During the formation of the opening in which a contact is formed, the etch rate of the etch-stop material is desirably lower than that of the dielectric layer. The bottom surface of the opening can thus stop on the DSG cut structure, instead of extending into the channel structure. The channel structure, in contact with the DSG cut structure, is thus less susceptible to over-etch in the formation of the contact. Short circuits and/or leakage are thus less likely to happen in the 3D memory devices disclosed herein.

Figure 1B:
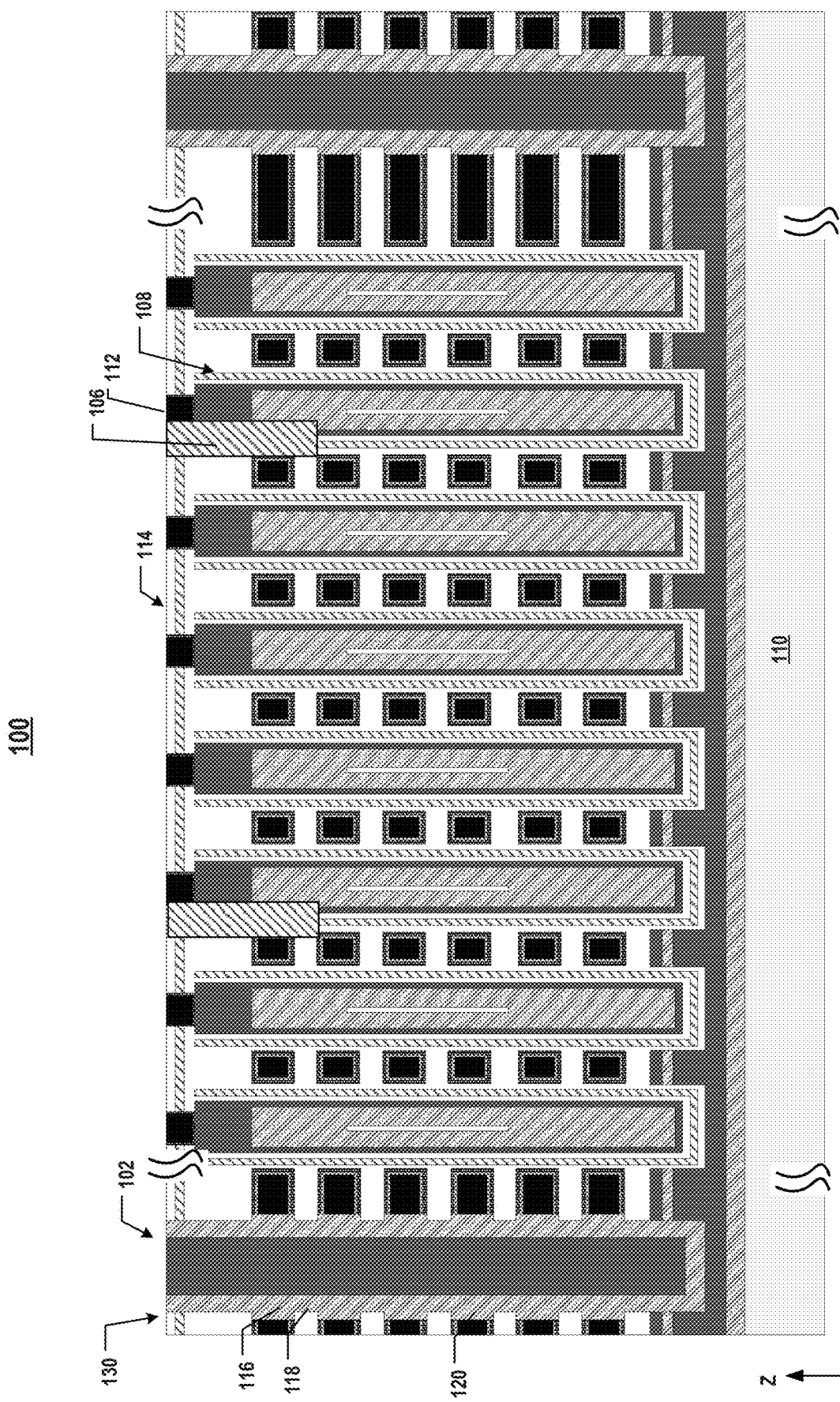
FIG. 1B illustrates a cross-section view of the exemplary 3D memory device, according to some aspects of the present disclosure.

FIG. 1A illustrates a top view of a 3D memory device 100, according to some aspects of the present disclosure. FIG. 1B illustrates a cross-sectional view of 3D memory device 100 along the A-A' direction, according to some aspects of the present disclosure. For illustrative purposes, only part of the 3D memory device is depicted in FIG. 1B. FIGS. 1A and 1B are described together.

3D memory device 100 may include a substrate 110, which may include silicon (e.g., single crystalline silicon), silicon germanium (SiGe), gallium arsenide (GaAs), germanium (Ge), silicon on insulator (SOI), germanium on insulator (GOI), or any other suitable materials. In some implementations, substrate 110 is a thinned substrate (e.g., a semiconductor layer), which was thinned by grinding, etching, chemical mechanical polishing (CMP), or any combination thereof. It is noted that x-, y-, and z-axes are included in FIGS. 1A and 1B to further illustrate the spatial relationship of the components in 3D memory device 100. Substrate 110 of 3D memory device 100 includes two lateral surfaces (e.g., a top surface and a bottom surface) extending laterally in the x-direction and y-direction (i.e., the lateral directions). As used herein, whether one component (e.g., a layer or a device) is "on," "above," or "below" another component (e.g., a layer or a device) of a 3D memory device (e.g., 3D memory device 100) is determined relative to the substrate of the 3D memory device (e.g., substrate 110) in the z-direction (i.e., the vertical direction) when the substrate is positioned in the lowest plane of the 3D memory device in the y-direction. The same notion for describing spatial relationships is applied throughout the present disclosure.

3D memory device 100 may be part of a monolithic 3D memory device. The term "monolithic" means that the components (e.g., the peripheral device and memory array device) of the 3D memory device are formed on a single substrate. For monolithic 3D memory devices, the fabrication encounters additional restrictions due to the convolution of the peripheral device processing and the memory array device processing. For example, the fabrication of the memory array device (e.g., NAND memory strings) is constrained by the thermal budget associated with the peripheral devices that have been formed or to be formed on the same substrate.

Alternatively, 3D memory device 100 may be part of a non-monolithic 3D memory device, in which components (e.g., the peripheral device and memory array device) may be formed separately on different substrates and then bonded, for example, in a face-to-face manner. In some implementations, the memory array device substrate (e.g., substrate 110 remains as the substrate of the bonded non-monolithic 3D memory device, and the peripheral device (e.g., including any suitable digital, analog, and/or mixed-signal peripheral circuits used for facilitating the operation of 3D memory device 100, such as page buffers, decoders, and latches; not shown) is flipped and faces down toward the memory array device (e.g., NAND memory strings) for hybrid bonding. It is understood that in some implementations, the memory array device substrate (e.g., substrate 110) is flipped and faces down toward the peripheral device (not shown) for hybrid bonding, so that in the bonded non-monolithic 3D memory device, the memory array device is above the peripheral device. The memory array device substrate (e.g., substrate 110) may be a thinned substrate (which is not the substrate of the bonded non-monolithic 3D memory device), and the back-end-of-line (BEOL) interconnects of the non-monolithic 3D memory device may be formed on the backside of the thinned memory array device substrate.

In some implementations, 3D memory device 100 is a NAND Flash memory device in which memory cells are provided in the form of an array of NAND memory strings, e.g., channel structures, each extending vertically above substrate 110. FIG. 1A illustrates the plan view of part of a memory block 101 in 3D memory device 100, according to some aspects of the present disclosure. Memory block 101 may include a plurality of memory cells (not shown) arranged between a pair of slit structures 102. The memory cells, arranged in an array, are formed in a plurality of channel structures 108 between slit structures 102. 3D memory device 100 may also include one or more DSG cut structures 106 each between a pair of adjacent strings 104.

As shown in FIG. 1B, 3D memory device 100 may include a stack structure 130, and a plurality of channel structures 108 extending vertically through stack structure 130 in the z-direction. Stack structure 130 may include interleaved stack conductive layers and stack dielectric layers 118 above substrate 110. The stack conductive layers may include one or more DSG lines 116, e.g., on a top portion of stack structure 130, and a plurality of control gate lines (e.g., word lines) 120. For example, DSG lines 116 may be the top stack conductive layers, and the number of DSG lines may be 1, 2, 3, 4, etc. The number of the stack conductive layers may be any suitable positive number such as 16, 432, 64, 96, 128, 256, etc. The stack conductive layers (DSG lines 116 and word lines 120) may have conductive materials including, but not limited to, tungsten (W), cobalt (Co), copper (Cu), aluminum (Al), polysilicon, doped silicon, silicides, or any combination thereof. Stack dielectric layers 118 may include dielectric materials including, but not limited to, silicon oxide, silicon nitride, silicon oxynitride, or any combination thereof.

The intersection of a control gate line 120 and a channel structure 108 forms a memory cell. 3D memory device 100 may include a plurality, e.g., an array, of channel structures 108 located between slit structures 102 in the y-direction. In some implementations, channel structures 108 may be arranged in rows each extending in the x-direction, and the plurality of rows are arranged in the y-direction. In some implementations, memory block 101 includes 4×M rows of channel structures 108 arranged in the y-direction, M being a positive integer. For example, memory block 101 may include 8 rows, 12 rows, 16 rows, etc. In some implementations, as shown in FIG. 1A, memory block 101 includes 16 rows of channel structures 108.

Channel structure 108 may include a channel hole filled with semiconductor materials (e.g., as a semiconductor channel) and dielectric materials (e.g., as a memory film). In some implementations, the semiconductor channel includes silicon, such as amorphous silicon, polysilicon, or single crystalline silicon. In some implementations, the memory film is a composite layer including a tunneling layer, a storage layer (also known as a "charge trap layer"), and a blocking layer. In some implementations, the remaining space of channel structure 108 may be partially or fully filled with a filling layer including dielectric materials, such as silicon oxide. Channel structure 108 may have a cylinder shape (e.g., a pillar shape). The filling layer, the semiconductor channel, the tunneling layer, the storage layer, and the blocking layer are arranged radially from the center toward the outer surface of the pillar in this order, according to some implementations. The tunneling layer may include silicon oxide, silicon oxynitride, or any combination thereof. The storage layer may include silicon nitride, silicon oxynitride, silicon, or any combination thereof. The blocking layer may include silicon oxide, silicon oxynitride, high dielectric constant (high-k) dielectrics, or any combination thereof. In one example, the memory film may include a composite layer of silicon oxide/silicon oxynitride (or silicon nitride)/silicon oxide (ONO).

In some implementations, channel structure 108 may further include a semiconductor plug, in a lower portion (e.g., at the lower end) of channel structure 108. As used herein, the "upper end" of a component (e.g., channel structure 108) is the end farther away from substrate 110 in the z-direction, and the "lower end" of the component (e.g., channel structure 108) is the end closer to substrate 110 in the z-direction when substrate 110 is positioned in the lowest plane of 3D memory device 100. The semiconductor plug may include a semiconductor material, such as silicon, which can be epitaxially grown from substrate 110 in any suitable directions or deposited over substrate 110. It is understood that in some implementations, the semiconductor plug includes single crystalline silicon, the same material as substrate 110. In other words, the semiconductor plug may include an epitaxially-grown semiconductor layer that is the same as the material of substrate 110. In some implementations, part of the semiconductor plug is above the top surface of substrate 110 and in contact with the semiconductor channel. The semiconductor plug may function as a channel controlled by a source select gate of channel structure 108. It is understood that in some implementations, 3D memory device 100 does not include the semiconductor plug, as shown in FIG. 1B.

In some implementations, channel structure 108 further includes a channel plug in an upper portion (e.g., at the upper end) of channel structure 108. The channel plug may be in contact with the upper end of the semiconductor channel. The channel plug may include semiconductor materials (e.g., polysilicon). By covering the upper end of channel structure 108 during the fabrication of 3D memory device 100, the channel plug may function as an etch stop layer to prevent etching of dielectrics filled in channel structure 108, such as silicon oxide and silicon nitride. In some implementations, the channel plug also functions as the drain of channel structure 108.

Slit structures 102 may each extend vertically (e.g., in the z-direction) and laterally (e.g., in the x-direction) in stack structure 130. Slit structures 102 may also be referred to as the gate-line slits. In some implementations, a source contact structure, as part of array common sources (ACS) that apply a source voltage on channel structures 108, can be formed. Slit structures 102 may be in contact with substrate 110. In some implementations, the source contact structures in slit structures 102 may each include a dielectric spacer and a source contact in the dielectric spacer. The source contact may be conductively connected to substrate 110. The source contact may include conductive materials including, but not limited to, tungsten (W), cobalt (Co), copper (Cu), aluminum (Al), polysilicon, doped silicon, silicides, or any combination thereof. The dielectric spacer may include dielectric materials including, but not limited to, silicon oxide, silicon nitride, silicon oxynitride, or any combination thereof.

3D memory device 100 may further include a dielectric layer 114 over and in contact with channel structure 108 (e.g., the channel plug of channel structure 108), and a contact 112 in dielectric layer 114. Contact 112 may be in contact with channel structure 108 (e.g., the channel plug/drain of channel structure 108). Dielectric layer 114 may include a single layer or multiple layers, and may include one or more dielectric materials. In some implementations, dielectric layer 114 may include dielectric materials including, but not limited to, silicon oxide, silicon nitride, silicon oxynitride, or any combination thereof. For example, dielectric layer 114 may include a silicon nitride layer sandwiched by a pair of silicon oxide layers. In some implementations, the channel plug (e.g., drain) of channel structure 108 is in contact with a silicon oxide layer. In some implementations, contact 112 may include conductive materials including, but not limited to, tungsten (W), cobalt (Co), copper (Cu), aluminum (Al), polysilicon, doped silicon, silicides, or any combination thereof. Contact 112 may apply a drain voltage on channel structure 108 during operations.

One or more DSG cut structures 106 may each extend vertically (e.g., in the z-direction) and laterally (e.g., in the x-direction) in stack structure 130. DSG cut structures 106 may each be positioned between adjacent strings 104 of memory block 101. For example, memory block 101 may include 16 rows of channel structures 108 that are divided into four strings 104 by three DSG cut structures 106. As shown in FIGS. 1A and 1B, DSG cut structure 106 may be in contact with a plurality of channel structures 108 in the first row of each string 104. Channel structures 108, in contact with DSG cut structures 106, may be functional channel structures in which memory cells are formed. DSG cut structures 106 may also be in contact with one or more stack conductive layers in one of the adjacent strings 104 such that these stack conductive layers are disconnected/insulated from one string 104 to another string 104. The stack conductive layers, in contact with DSG cut structures 106, may be referred to as DSG lines 116. The portion of DSG lines 116 in each string 104 may form the DSGs of the respective string 104, and a gate-selective voltage may be applied on the DSGs for selecting the respective string 104 in operations. In some implementations, depending on the designs, the number of DSG lines 116 may be 1, 2, 3, 4, or other suitable positive numbers. In some implementations, the DSGs in each string 104 may be positioned at the top portion of stack structure 130 and may be referred to as the top select gates (TSGs). In some implementations, as shown in FIG. 1A, DSG cut structure 106 is in contact with two adjacent rows of channel structures 108. For ease of illustration, in the present disclosure, a DSG cut structure is depicted in contact with one channel structure in FIGS. 1B-1E and 2A-2H as an example.

DSG cut structures 106 may include a different material than dielectric layer 114. In some implementations, DSG cut structure 106 may include a dielectric material that can function as the etch-stop layer in the formation of contact 112. In some implementations, the etchant used to form the opening, in which contact 112 is located, has a higher etch rate on dielectric layer 114 than DSG cut structure 106. For example, the etch selectivity of dielectric layer 114 over DSG cut structure 106 may be greater than 1. In some implementations, dielectric layer 114 includes silicon oxide, and DSG cut structure 106 includes silicon nitride.

Figure 1C:
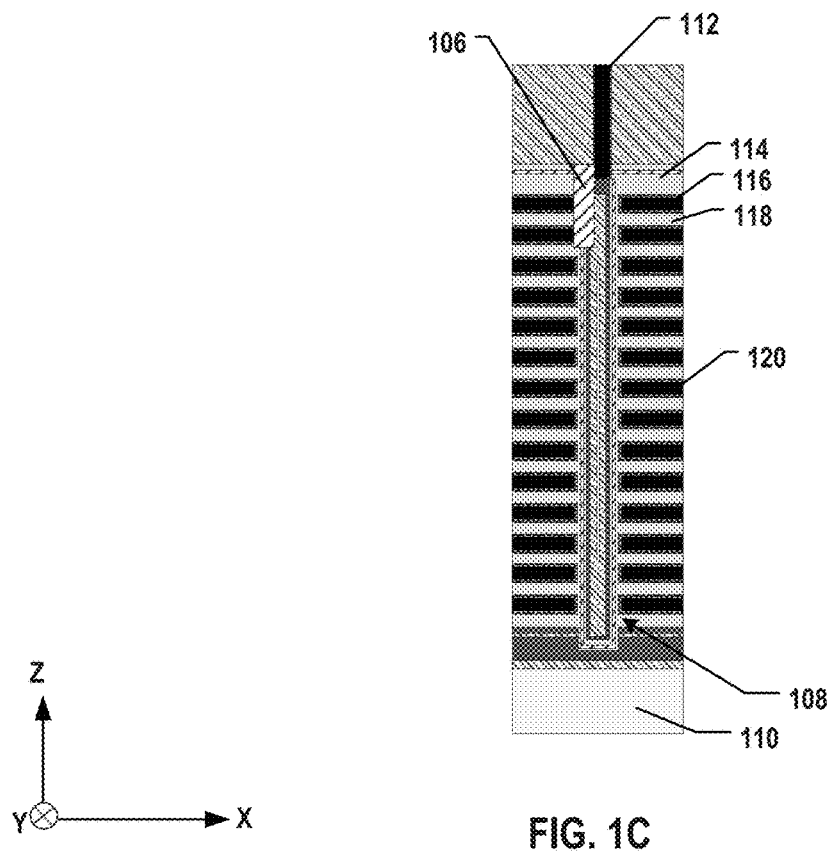
FIGS. 1C-1E each illustrates an exemplary DSG cut structure in the 3D memory device, according to some aspects of the present disclosure.
Figure 1D:
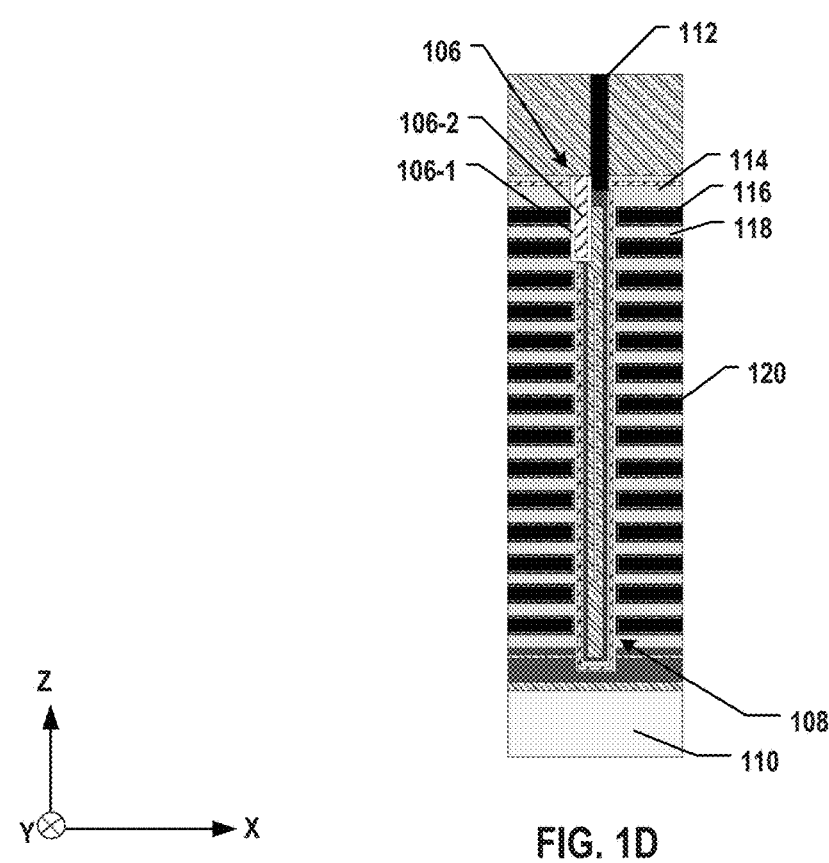
Figure 1E:
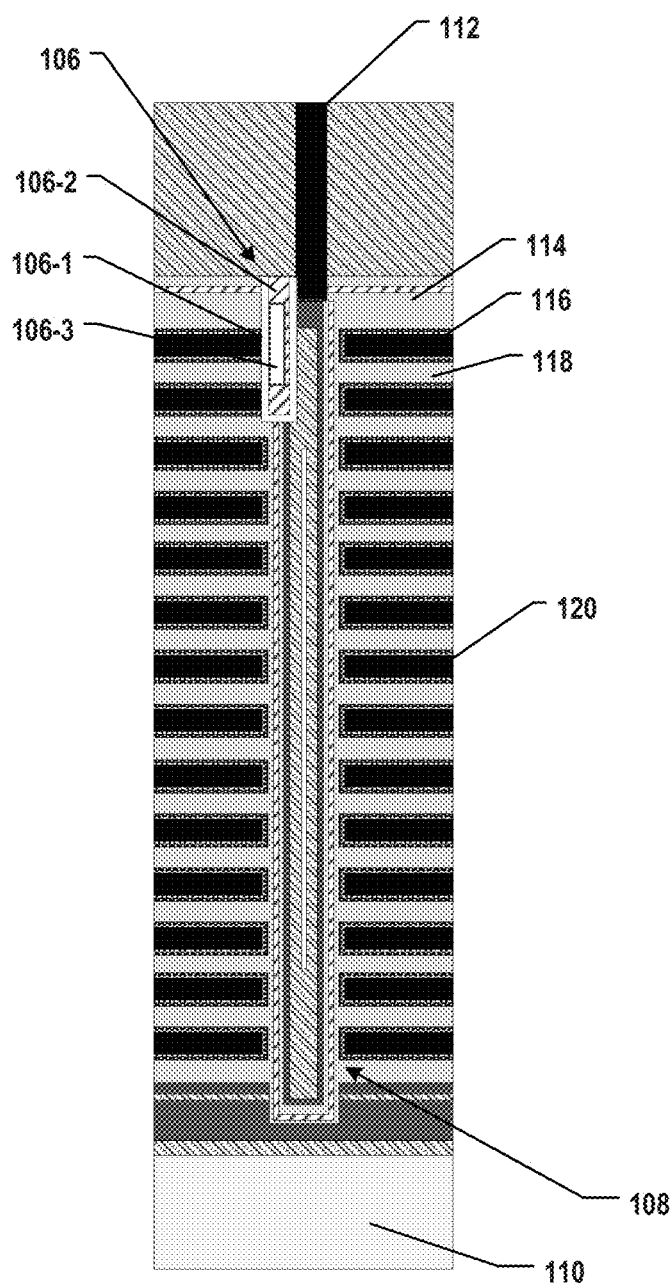

FIGS. 1C-1E each illustrates a structure of DSG cut structure 106, according to some aspects of the present disclosure. In one example, as shown in FIG. 1C, DSG cut structure 106 may include silicon nitride. In some implementations, DSG cut structure 106 consists of an etch-stop layer, such as a silicon nitride layer. In another example, as shown in FIG. 1D, DSG cut structure 106 may include a liner layer 106-1 and an etch-stop layer 106-2 surrounded by and in contact with liner layer 106-1. Liner layer 106-1 may be in contact with channel structure 108 and DSG lines 116. The top surface of etch-stop layer 106-2 may be coplanar with the top surface of dielectric layer 114. In some implementations, liner layer 106-1 includes silicon oxide, and etch-stop layer 106-2 includes silicon nitride. In a further example, as shown in FIG. 1E, DSG cut structure 106 may include a liner layer 106-1, an etch-stop layer 106-2 surrounded by and in contact with liner layer 106-1, and a filler layer 106-3 surrounded by and in contact with (e.g., in) etch-stop layer 106-2. The material of filler layer 106-3 may be different from that of etch-stop layer 106-2. For example, filler layer 106-3 may include silicon oxide, silicon oxynitride, or an airgap. In some implementations, filler layer 106-3 includes an airgap. In the examples shown in FIGS. 1D and 1E, a thickness of liner layer 106-1 may range between 2 nm to 8 nm (e.g., 2 nm, 3 nm, 5 nm, 7 nm, 8 nm). For example, the thickness of liner layer 106-1 may be about 5 nm.

Figure 2A:
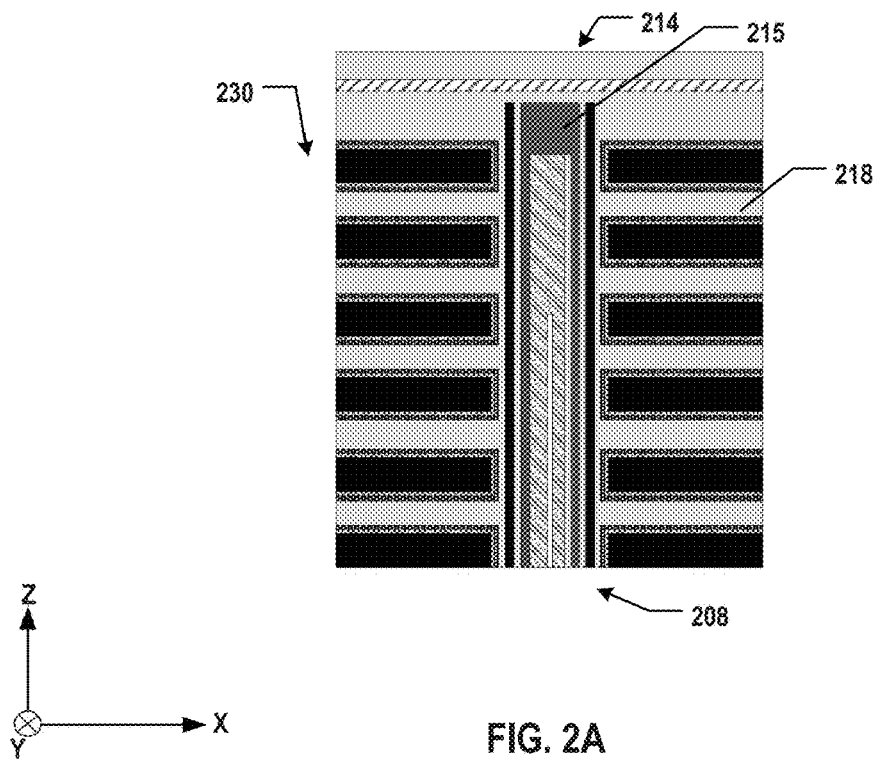
FIGS. 2A-2H illustrate cross-sections of an exemplary 3D memory device at different stages of a fabrication process, according to some aspects of the present disclosure.
Figure 2B:
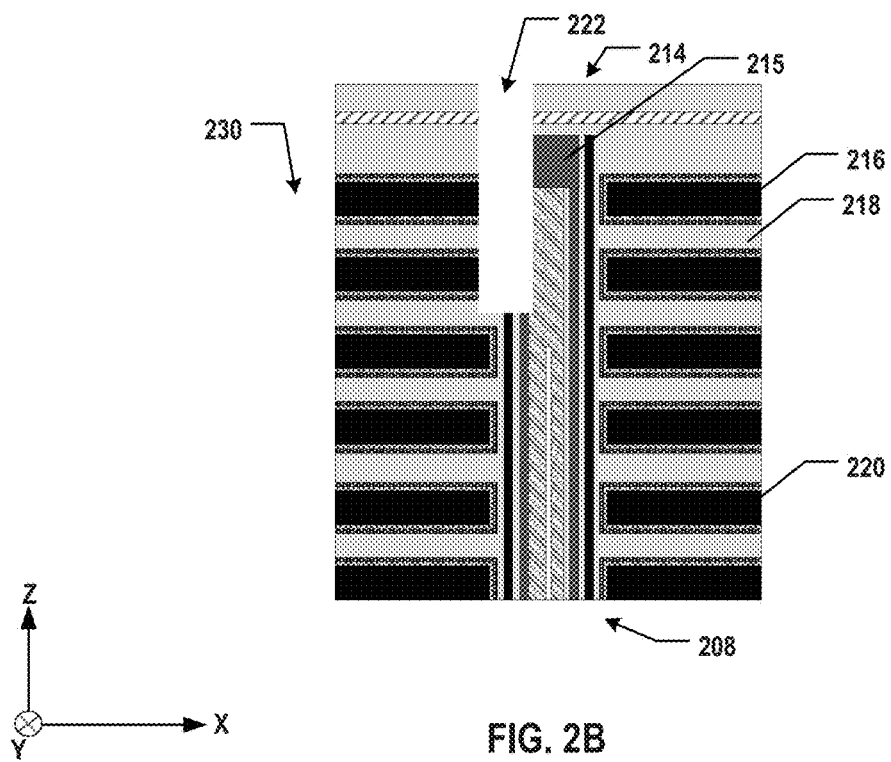
Figure 2C:
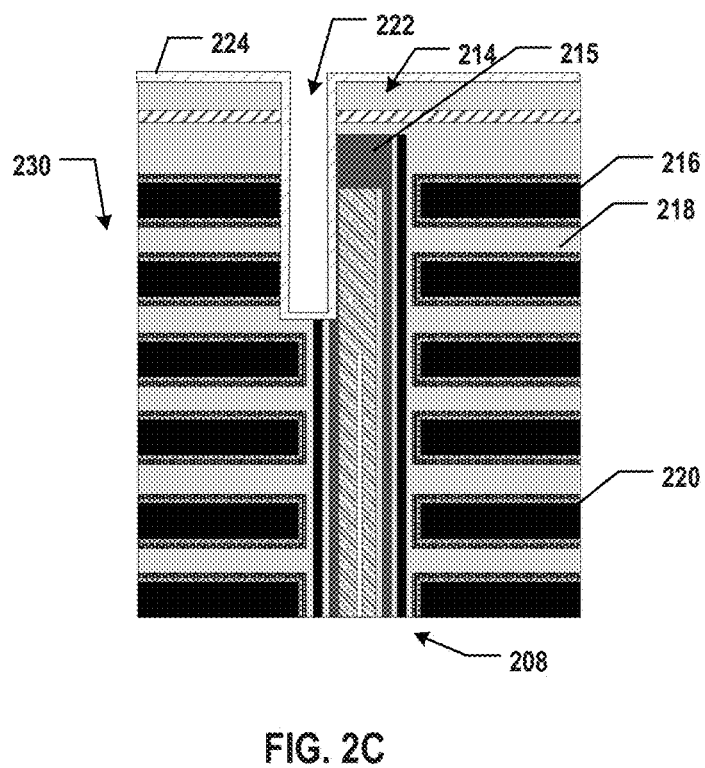
Figure 2D:
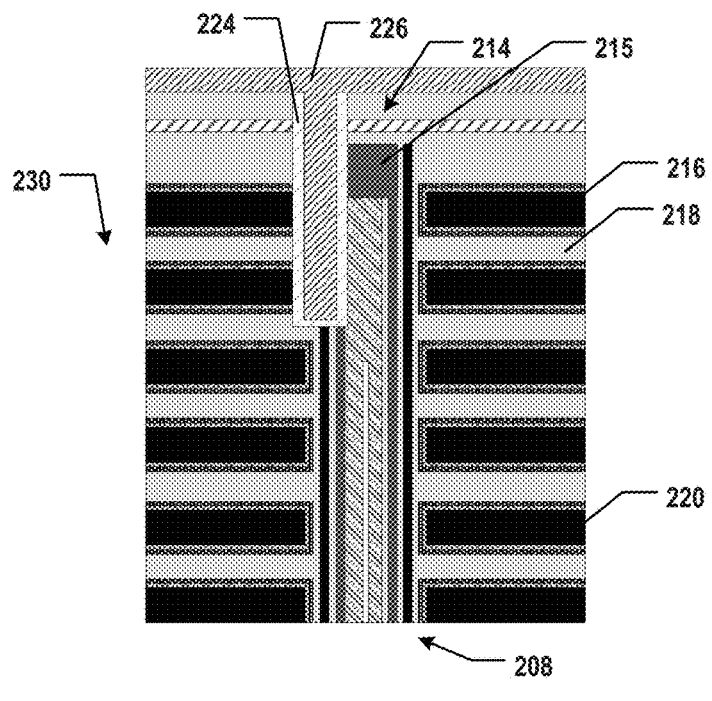
Figure 2E:
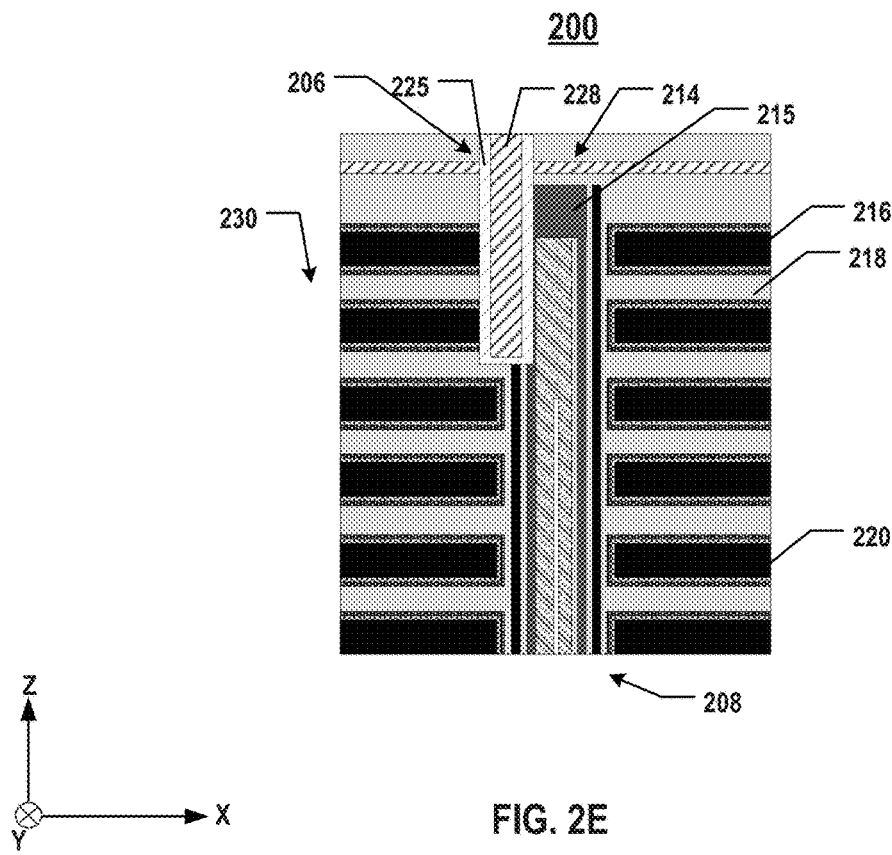
Figure 2F:
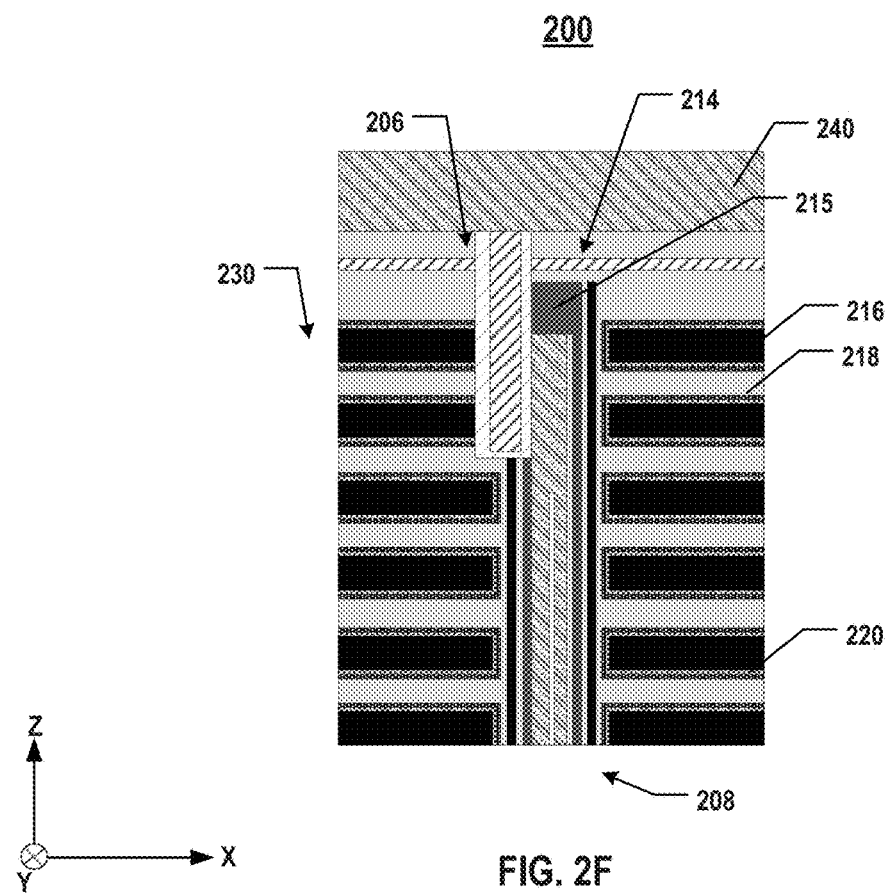
Figure 2G:
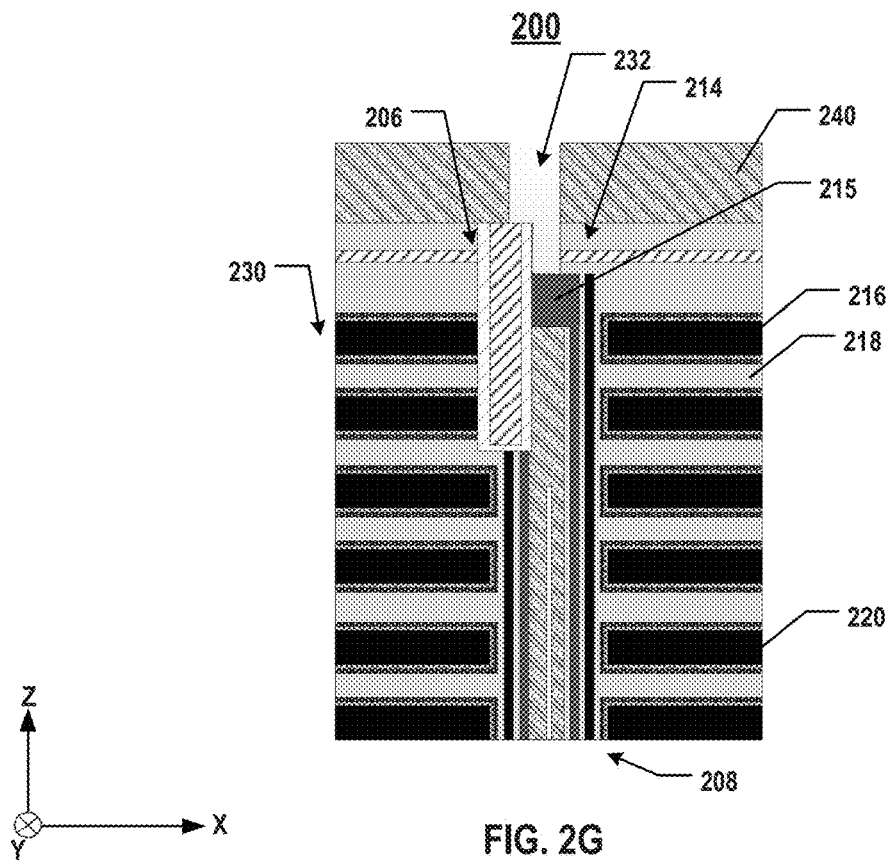
Figure 2H:
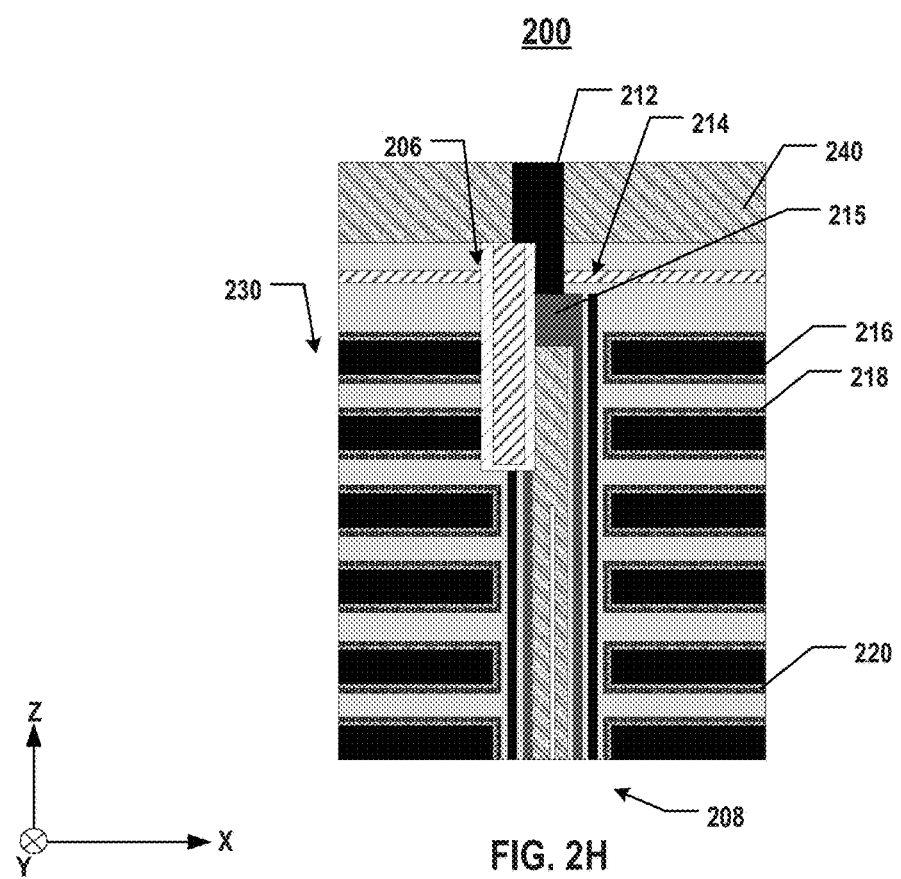
Figure 3:
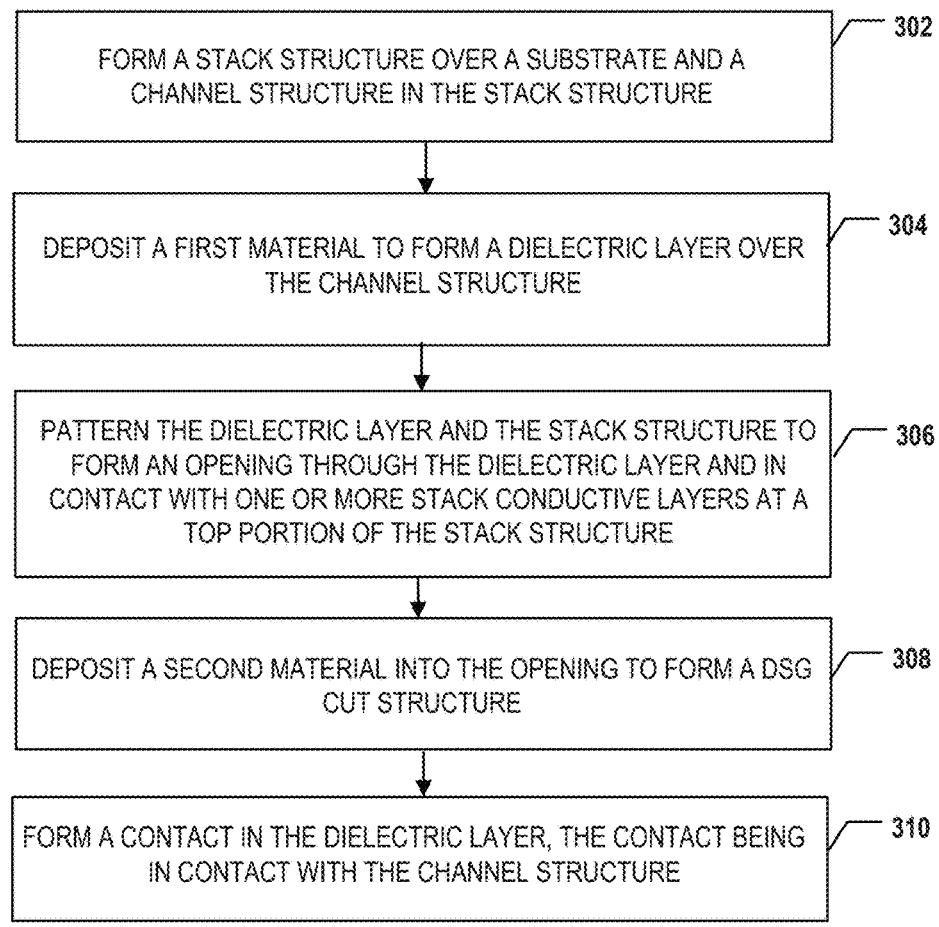
FIG. 3 illustrates a flowchart of an exemplary method for forming a 3D memory device, according to some aspects of the present disclosure.

FIGS. 2A-2H illustrate cross-sections of a 3D memory device 200 at different stages of a manufacturing process, according to some aspects of the present disclosure. FIG. 3 illustrates a flowchart of an exemplary method 300 for forming 3D memory device 200, according to some aspects of the present disclosure. 3D memory device 200 may be an example of 3D memory device 100. For illustrative purposes, FIGS. 2A-2H and method 300 will be discussed together. It is understood that the operations shown in method 300 are not exhaustive and that other operations may be performed as well before, after, or between any of the illustrated operations. Further, some of the operations may be performed simultaneously, or in a different order than shown in FIGS. 2A-2H and 3.

Method 300 starts at operation 302, in which a stack structure is formed over a substrate, and a channel structure is formed in the stack structure. FIG. 2A illustrates a corresponding structure.

As shown in FIG. 2A, a stack structure 230 is formed over a substrate (not shown), and a channel structure 208 may be formed extending vertically in stack structure 230. Stack structure 230 may include a plurality of stack conductive layers (e.g., DSG lines 216 and control gate lines 220) interleaved with a plurality of stack dielectric layers 218.

To form stack structure 230, a plurality of first material layers and a plurality of second material layers are deposited on a substrate to stack above a substrate. In a "gate-last" process, a dielectric stack (not shown) having a plurality of alternating stack dielectric layers and stack sacrificial layers may be formed above a substrate. The stack dielectric layers and stack sacrificial layers may form a plurality of stack dielectric/sacrificial layer pairs over the substrate. A gate replacement process may be performed subsequently to form the stack conductive layers in stack structure 230. In some implementations, the substrate may include a silicon substrate. The stack dielectric layers and the stack sacrificial layers may include different materials. In some implementations, each stack dielectric layer may include a layer of silicon oxide, and each stack sacrificial layer may include a layer of silicon nitride. The dielectric stack may be formed by one or more thin film deposition processes including, but not limited to, chemical vapor deposition (CVD), physical vapor deposition (PVD), atomic layer deposition (ALD), or any combination thereof. In some implementations, a pad oxide layer (not shown) is formed between the substrate and the dielectric stack by depositing dielectric materials, such as silicon oxide, on the substrate.

In a "gate-first" process, a stack of interleaved stack conductive layers and stack dielectric layers may be formed over a substrate, and no gate replacement process is needed. The stack conductive layers may each include a layer of polysilicon, and the stack dielectric layers may each include a layer of silicon oxide. The stack may be formed by one or more thin film deposition processes including, but not limited to, CVD, PVD, ALD, or any combination thereof. In some implementations, the interleaved first material layers and the second material layers may undergo a trimming process, in which the first material layers and the second material layers are patterned repeatedly to form a staircase structure on one or more sides of stack structure 230. The trimming process may include photolithography and etching processes (e.g., wet etch and/or dry etch).

A channel structure 208 may be formed extending through stack structure 230 (e.g., a dielectric stack) in the z-direction. Channel structure 208 may include a channel plug 215 (e.g., the drain of channel structure 208) at the top portion of channel structure 208 (or stack structure 230). Channel plug 215 may include polysilicon and/or metal, and may be subsequently conductively connected to a contact that applies a drain voltage on channel structure 208. In some implementations, an etch process may be performed to form a plurality of channel holes extending vertically through the interleaved stack dielectric/sacrificial layer pairs. In some implementations, fabrication processes for forming the channel holes may include wet etching and/or dry etching, such as deep reactive ion etching (DRIE). In some implementations, the channel holes may extend further into the top portion of the substrate. After the formation of the channel holes, in some implementations, an epitaxial operation, e.g., a selective epitaxial growth operation, may be performed to form the semiconductor plugs at the bottom of a channel hole. The memory film, including a tunneling layer, a storage layer, a blocking layer, and a semiconductor channel can be formed in the channel hole. Optionally, a filling layer may be formed in the channel hole. In some implementations, channel structures 208 may not include a semiconductor plug. The deposition of the memory film, the semiconductor channel, and the filling layer may include any suitable thin-filmed deposition processes such as CVD, PVD, ALD, or any combination thereof. The deposition of channel plug 215 may include CVD, PVD, ALD, electroplating, electroless plating, or any combination thereof.

A plurality of gate line slits (not shown) may be formed extending through stack structure 230 in the z-direction. The gate line slits, in which the source contact structures are formed, may extend laterally in the x-direction, referring back to FIG. 1A. The gate line slits may be in contact or extend into the top portion of the substrate. In some implementations, fabrication processes for forming the gate line slits may include wet etching and/or dry etching, such as deep reactive ion etching (DRIE).

In a gate-last process, anisotropic etching process may be performed to remove the stack sacrificial layers and form a plurality of lateral recesses. One or more thin filmed deposition processes such as CVD, PVD, and/or ALD may be performed to form a plurality of stack conductive layers in the lateral recesses. In some implementations, the stack conductive layers include W.

A source contact structure (e.g., referring back to source contact structure 102) may then be formed in each gate line slit. The source contact structure may include a dielectric spacer (e.g., silicon oxide) and a source contact (e.g., W) in the dielectric spacer. The formation of the dielectric spacer may include one or more thin filmed deposition processes such as CVD, PVD, and/or ALD. The formation of the source contact may include CVD, PVD, ALD, electroplating, electroless plating, or any combination thereof.

Method 300 proceeds to operation 304, in which a first material is deposited to form a dielectric layer over the channel structure. FIG. 2A illustrates a corresponding structure.

A shown in FIG. 2A, after stack structure 230 and channel structure 208 are formed, a dielectric layer 214 is formed over and in contact with channel structure 208. The formation of dielectric layer 214 may include deposition of a first material, e.g., silicon oxide. In some implementations, dielectric layer 214, having a single layer or multiple layers, includes silicon oxide, silicon nitride, and/or silicon oxynitride. In some implementations, dielectric layer 214 includes a silicon nitride layer sandwiched by a pair of silicon oxide layers. In some implementations, channel structure 208 (e.g., the drain of channel structure 208) is in contact with a layer of silicon oxide, which is part of dielectric layer 214.

The formation of dielectric layer 214 may include one or more thin filmed deposition processes such as CVD, PVD, and/or ALD.

Method 300 proceeds to operation 306, in which the dielectric layer and the stack structure are patterned to form an opening, the opening being through the dielectric layer and in contact with one or more stack conductive layers at a top portion of the stack structure. FIG. 2B illustrates a corresponding structure.

As shown in FIG. 2B, after the formation of dielectric layer 214, an opening 222 is formed through dielectric layer 214 and into stack structure 230. Opening 222 may be in contact with a top portion of channel structure 208 and one or more stack conductive layers at the top portion of stack structure 230. For example, in the x-y plane, opening 222 may partially overlap with channel structure 208 and the one or more stack conductive layers. Opening 222 may disconnect the one or more stack conductive layers from channel structure 208. At least a portion of channel plug 215 is retained intact for subsequent conductive connection to a contact. In some implementations, opening 222 is positioned between channel structure 208 and the one or more stack conductive layers, and a bottom surface of opening 222 may be below the bottom surfaces of the one or more stack conductive layers. The number of stack conductive layers disconnected by opening 222 may be 1, 2, 3, 4, etc. The disconnected stack conductive layers may form DSG lines 216, and the stack conductive layers below DSG lines 216 may include control gate lines 220. In some implementations, the formation of an opening 222 includes a photolithography process and an etching process (e.g., wet etch and/or dry etch).

Method 300 proceeds to operation 308, in which a second material is deposited into the opening to form a DSG cut structure. FIGS. 2C-2E illustrate corresponding structures.

After the formation of opening 222, a second material may be deposited into opening 222 to form a DSG cut structure. The second material may include silicon nitride, which can function as an etch-stop material in the subsequent etching of dielectric layer 214. In some implementations, the second material also includes other non-conductive materials such as other dielectric materials and/or an air gap. In some implementations, the second material consists of silicon nitride, and the deposition of the second material may include one or more thin filmed deposition processes such as CVD, PVD, and/or ALD. A planarization process, such as chemical-mechanical polishing (CMP) and/or recess etching, is performed after the deposition to remove any excess deposited material over dielectric layer 214.

As an example, FIGS. 2C-2E illustrate a structure in which the second material includes silicon nitride and silicon oxide. As shown in FIG. 2C, a liner material layer 224 of a suitable material, e.g., silicon oxide, may be deposited into opening 222. In some implementations, liner material layer 224 has a thickness of 2 nm to 8 nm, such as 5 nm, and can be deposited using ALD. Liner material layer 224 may cover the bottom surface and side surface of opening 222. As shown in FIG. 2D, an etch-stop material layer 226 may be deposited over liner material layer 224 to fill up opening 222. The deposition of etch-stop material layer 226 may include one or more thin filmed deposition processes such as CVD, PVD, and/or ALD. In some implementations, an air gap (not shown) is formed in etch-stop material layer 226. The formation of the air gap may include any suitable fabrication process, such as rapid thermal sealing. The air gap may be surrounded, e.g., sealed, by etch-stop material layer 226.

As shown in FIG. 2E, a planarization process, such as CMP and/or recess etching, is performed after the deposition of etch-stop material layer 226 to remove any excess deposited material over dielectric layer 214. A DSG cut structure 206, having a liner layer 225 (e.g., silicon oxide) and an etch-stop layer 228 (e.g., silicon nitride), may be formed. Liner layer 225 may surround etch-stop layer 228 at the bottom surface and side surfaces of etch-stop layer 228. In some implementations, a top surface of DSG cut structure 206 may be coplanar with dielectric layer 214.

Method 300 proceeds to operation 310, in which a contact is formed in the dielectric layer, the contact being in contact with the channel structure. FIGS. 2F-2H illustrate corresponding structures.

As shown in FIG. 2F, after the formation of DSG cut structure 206, a cap layer 240 may be formed over dielectric layer 214 and DSG cut structure 206. Cap layer 240 may cover at least DSG cut structure 206 and channel structure 208. In some implementations, cap layer 240 includes a dielectric material such as silicon oxide, and can be deposited using one or more thin filmed deposition processes such as CVD, PVD, and/or ALD.

As shown in FIG. 2G, an opening 232 may be formed in cap layer 240 and dielectric layer 214. Opening 232 may extend through dielectric layer 214 and be in contact with channel structure 208 (e.g., channel plug 215). In some implementations, opening 232 may be in contact with DSG cut structure 206, e.g., partially landed on DSG cut structure 206, as shown in FIG. 2G. At least a top surface of etch-stop layer 228 may be exposed by the etching to form opening 232. Part of liner layer 225 in contact with opening 232 may or may not be partially removed by the etching process that forms opening 232. In some implementations, linear layer 225 may be fully or partially retained on the etch-stop layer 228 in opening 232. For example, when linear layer 225 is fully or partially removed in opening 232, the side surface etch-stop layer 228 may be exposed in opening 232. In another example, when linear layer 225 is fully retained, the side surface of etch-stop layer 228 is covered by linear layer 225 in opening 232. In some implementations, because the thickness of liner layer 225 is desirably thin, etch-stop layer 228 still prevents the etching of channel structure 208. Channel structure 208 is thus less susceptible to damages during the formation of opening 232. In some implementations, the formation of opening 232 includes a photolithography process and an etching process (e.g., dry etch and/or wet etch).

As shown in FIG. 2H, a conductive material is deposited to fill opening 232, and a contact 212 is formed. Contact 212 may extend in cap layer 240, through dielectric layer 214, and in contact with channel plug 215 of channel structure 208. In some implementations, if linear layer 225 is partially or fully removed in opening 232, contact 212 is in contact with the side surface and the top surface of etch-stop layer 228. In some implementations, if linear layer 225 is fully retained on the side surface of etch-stop layer 228, contact 212 is in contact with etch-stop layer 228 on the top surface but not the side surface. In some implementations, the conductive material includes tungsten (W), and the deposition includes CVD, PVD, ALD, electroplating, electroless plating, or any combination thereof. In some implementations, an adhesive layer, e.g., titanium nitride (TiN), is deposited on the side surfaces of opening 232 before the deposition of tungsten. In some implementations, the deposition of the adhesive layer includes CVD, PVD, ALD, or any combination thereof.

Figure 4:
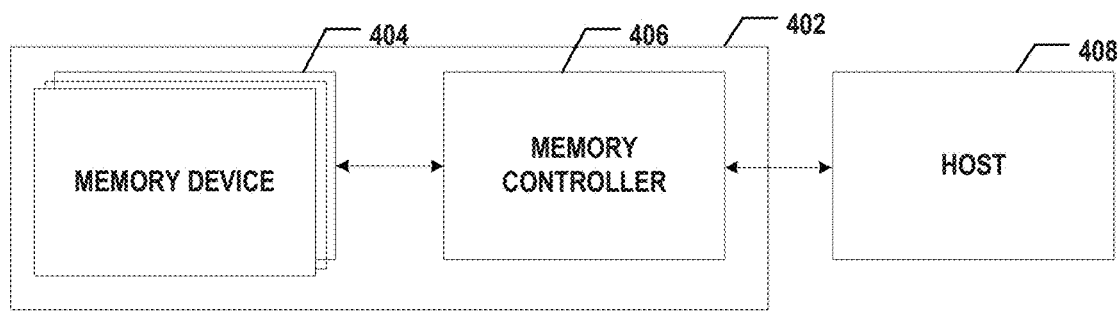
FIG. 4 illustrates a block diagram of an exemplary system having a memory device, according to some aspects of the present disclosure.

FIG. 4 illustrates a block diagram of an exemplary system 400 having a memory device, according to some aspects of the present disclosure. System 400 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 4, system 400 can include a host 408 and a memory system 402 having one or more memory devices 404 and a memory controller 406. Host 408 can be a processor of an electronic device, such as a central processing unit (CPU), or a system-on-chip (SoC), such as an application processor (AP). Host 408 can be configured to send or receive data to or from memory devices 404.

Memory device 404 can be any memory device disclosed in the present disclosure. As disclosed above in detail, memory device 404, such as a NAND Flash memory device, may have one or more DSG cut structures having an etch-stop material. Memory controller 406 is coupled to memory device 404 and host 408 and is configured to control memory device 404, according to some implementations. Memory controller 406 can manage the data stored in memory device 404 and communicate with host 408. For example, memory controller 406 may be coupled to memory device 404, such as 3D memory device 100 described above, and memory controller 406 may be configured to control operations of channel structure 108 of 3D memory device 100 through the DSG lines 116.

In some implementations, memory controller 406 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 406 is designed for operating in a high duty-cycle environment SSDs or embedded multi-media-cards (eMMCs) used as data storage for mobile devices, such as smartphones, tablets, laptop computers, etc., and enterprise storage arrays. Memory controller 406 can be configured to control operations of memory device 404, such as read, erase, and program operations. Memory controller 406 can also be configured to manage various functions with respect to the data stored or to be stored in memory device 404 including, but not limited to bad-block management, garbage collection, logical-to-physical address conversion, wear leveling, etc. In some implementations, memory controller 406 is further configured to process error correction codes (ECCs) with respect to the data read from or written to memory device 404. Any other suitable functions may be performed by memory controller 406 as well, for example, formatting memory device 404. Memory controller 406 can communicate with an external device (e.g., host 408) according to a particular communication protocol. For example, memory controller 406 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figures 5A, 5B:
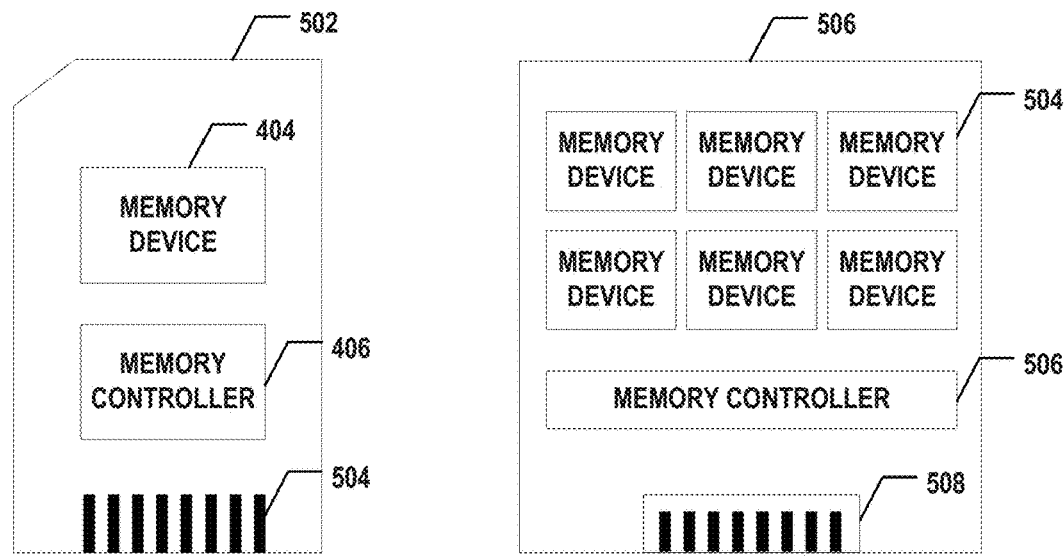
FIG. 5A illustrates a diagram of an exemplary memory card having a memory device, according to some aspects of the present disclosure.
FIG. 5B illustrates a diagram of an exemplary solid-state drive (SSD) having a memory device, according to some aspects of the present disclosure.

Memory controller 406 and one or more memory devices 404 can be integrated into various types of storage devices, for example, be included in the same package, such as a universal Flash storage (UFS) package or an eMMC package. That is, memory system 402 can be implemented and packaged into different types of end electronic products. In one example as shown in FIG. 5A, memory controller 406 and a single memory device 404 may be integrated into a memory card 502. Memory card 502 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 502 can further include a memory card connector 504 coupling memory card 502 with a host (e.g., host 408 in FIG. 4). In another example as shown in FIG. 5B, memory controller 406 and multiple memory devices 404 may be integrated into an SSD 506. SSD 506 can further include an SSD connector 508 coupling SSD 506 with a host (e.g., host 408 in FIG. 4). In some implementations, the storage capacity and/or the operation speed of SSD 506 is greater than those of memory card 502.

According to one aspect of the present disclosure, a memory device includes a stack structure over a substrate, a channel structure extending in the stack structure, and a dielectric layer over the channel structure. The dielectric layer includes a first material. The memory device may also include a DSG cut structure extending through the dielectric layer. The DSG cut structure includes a second material different from the first material.

In some implementations, the DSG cut structure is in contact with the channel structure and a DSG in the plurality of conductive layers.

In some implementations, an etching selectivity of the first material over the second material is greater than 1.

In some implementations, the first and second materials each includes a respective dielectric material.

In some implementations, the first material includes silicon oxide, and the second material includes silicon nitride.

In some implementations, the DSG cut structure does not include silicon oxide.

In some implementations, the DSG cut structure includes silicon nitride.

In some implementations, the DSG cut structure includes a liner silicon oxide layer and a silicon nitride layer surrounded by the liner silicon oxide layer.

In some implementations, a thickness of the liner silicon oxide layer is in a range of 2 nm to 8 nm.

In some implementations, the DSG cut structure includes a silicon nitride layer surrounded by the liner silicon oxide layer, and an air gap surrounded by the silicon nitride layer.

In some implementations, the memory device further includes a pair of source contact structures extending in a lateral direction and a memory block between the pair of source contact structures. The memory block includes a plurality of memory cells in a plurality of channel structures between the source contact structures. The memory block includes a pair of strings adjacent to each other. Each of the strings includes a plurality of rows of channel structures in the lateral direction. The DSG cut structure, extending in the lateral direction, is between the pair of strings and is in contact with one of the rows of the channel structures.

In some implementations, each of the strings includes four rows of channel structures.

In some implementations, the memory block includes four strings. Each of the four strings includes four rows of channel structures extending in the lateral direction.

According to another aspect of the present disclosure, a memory system includes a memory device configured to store data. The memory device includes a stack structure over a substrate, a channel structure extending in the stack structure, a dielectric layer over the channel structure, the dielectric layer having a first material, and a DSG cut structure extending through the dielectric layer. The DSG cut structure includes a second material different from the first material. The memory system also includes a memory controller coupled to the memory device and configured to control operations of the channel structure.

According to another aspect of the present disclosure, a method for forming a memory device includes forming a stack structure over a substrate, forming a channel structure extending in the stack structure, depositing a first material to form a dielectric layer over the channel structure, and patterning the dielectric layer and the stack structure to form an opening, the opening through the dielectric layer and in contact with a conductive layer in a top portion of the stack structure. The method may also include depositing a second material into the opening to form a DSG cut structure. The second material is different from the first material. The method may further include forming a contact in the dielectric layer and in contact with the channel structure.

In some implementations, the opening is in contact with the channel structure.

In some implementations, depositing the first material includes depositing silicon oxide.

In some implementations, depositing the second material to form the DSG cut structure includes depositing silicon nitride.

In some implementations, depositing the second material to form the DSG cut structure includes depositing the silicon nitride to fill the opening.

In some implementations, depositing the second material to form the DSG cut structure includes depositing a liner oxide layer in the opening, the liner oxide layer in contact with surfaces of the opening, and depositing a silicon nitride layer to fill the opening.

In some implementations, the deposition of the liner oxide layer includes an ALD.

In some implementations, depositing the second material to form the DSG cut structure includes depositing a liner oxide layer in the opening. The liner oxide layer is in contact with surfaces of the opening. Depositing the second material may also include depositing a silicon nitride layer over the liner oxide layer, and forming an air gap in the silicon nitride layer during the deposition of the silicon nitride layer.

In some implementations, forming the contact in the dielectric layer includes etching the dielectric layer to form another opening in contact with the channel structure and the DSG cut structure, and depositing a conductive material to fill the other opening.

In some implementations, the DSG cut structure is an etch-stop layer of the etching of the dielectric layer.

In some implementations, an etch rate on the second material is lower than an etch rate on the first material in the etching of the dielectric layer.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A memory device, comprising:
a stack structure over a substrate;
a channel structure extending in the stack structure;
a dielectric layer over the channel structure, the dielectric layer comprising a first dielectric material;
a drain-select gate (DSG) cut structure comprising a second dielectric material different from the first dielectric material; and
a contact over the channel structure, the contact extending into the dielectric layer and contacting the DSG cut structure,
wherein:
the DSG cut structure is in contact with the channel structure and one or more conductive layers of the stack structure and in no contact with another channel structure in a cross-section of the channel structure perpendicular to a lateral direction along which the DSG cut structure extends; and
a bottommost surface of the contact is in direct contact with a top surface of a channel plug over the channel structure.

2. The memory device of claim 1, wherein the DSG cut structure is in contact with the channel structure and a DSG in a plurality of conductive layers.

3. The memory device of claim 1, wherein an etching selectivity of the first dielectric material over the second dielectric material is greater than 1.

4. The memory device of claim 1, wherein the first dielectric material comprises silicon oxide and the second dielectric material comprises silicon nitride.

5. The memory device of claim 1, wherein the DSG cut structure does not comprise silicon oxide.

6. The memory device of claim 5, where the DSG cut structure comprises silicon nitride.

7. The memory device of claim 1, wherein the DSG cut structure comprises a liner silicon oxide layer and a silicon nitride layer surrounded by the liner silicon oxide layer.

8. The memory device of claim 7, wherein the DSG cut structure comprises a silicon nitride layer surrounded by the liner silicon oxide layer, and a filler layer surrounded by the silicon nitride layer.

9. The memory device of claim 8, wherein the filler layer comprises an airgap.

10. The memory device of claim 1, further comprises a pair of source contact structures extending in the lateral direction and a memory block between the pair of source contact structures, the memory block comprising a plurality of memory cells in a plurality of channel structures between the source contact structures,
wherein
the memory block comprises a pair of strings adjacent to each other, each of the strings comprising a plurality of rows of channel structures in the lateral direction, and
the DSG cut structure, extending in the lateral direction, is between the pair of strings and is in contact with at least one of the rows of the channel structures.

11. The memory device of claim 10, wherein each of the strings comprises four rows of channel structures.

12. The memory device of claim 1, wherein a top surface of the dielectric layer is coplanar with an entire top surface of the DSG cut structure.

13. The memory device of claim 1, wherein the channel plug arranged at a top of the channel structure is in contact with a sidewall of the DSG cut structure, and an entire top surface of the DSG cut structure being higher than the top surface of the channel plug and the bottommost surface of the contact.

14. The memory device of claim 1, wherein the contact is in no contact with a sidewall of the channel plug, and the sidewall of the channel plug is in contact with a sidewall of the DSG cut structure.

15. The memory device of claim 1, wherein a first bottom surface of the contact in contact with the channel plug is lower than a second bottom surface of the contact in contact with the DSG cut structure.

16. A memory system, comprising:
a memory device configured to store data, the memory device comprising:
  a stack structure over a substrate,
  a channel structure extending in the stack structure,
  a dielectric layer over the channel structure, the dielectric layer comprising a first material silicon oxide,
  a drain-select gate (DSG) cut structure extending through the dielectric layer and comprising a second material, and
  a contact over the channel structure, the contact extending into the dielectric layer and contacting the DSG cut structure,
wherein;
  the DSG cut structure is in contact with the channel structure and one or more conductive layers of the stack structure and in no contact with another channel structure in a cross-section of the channel structure perpendicular to a lateral direction along which the DSG cut structure extends; and
  a bottommost surface of the contact is in direct contact with a top surface of a channel plug over the channel structure
a memory controller coupled to the memory device and configured to control operations of the channel structure.

17. The memory device of claim 16, wherein a sidewall of the DSG cut structure is in contact with a sidewall of the channel plug arranged at a top of the channel structure.

18. A memory device, comprising:
a stack structure;
a channel structure extending in the stack structure;
a dielectric layer over the channel structure, the dielectric layer comprising a first material;
a drain-select gate (DSG) cut structure; and
a contact over the channel structure, the contact extending into the dielectric layer and contacting the DSG cut structure,
wherein:
  the DSG cut structure comprises a second material different from the first material; and
  a bottommost surface of the contact is in direct contact with a top surface of a channel plug over the channel structure, and a sidewall of the channel plug is in direct contact with a sidewall of the DSG cut structure.

19. The memory device of claim 18, wherein a top surface of the dielectric layer is coplanar with an entire top surface of the DSG cut structure.

20. The memory device of claim 18, wherein the first material comprises a dielectric material.

* * * * *